(12) United States Patent
Miura et al.

(10) Patent No.: US 8,981,626 B2
(45) Date of Patent: Mar. 17, 2015

(54) PIEZOELECTRIC MATERIAL, PIEZOELECTRIC ELEMENT, LIQUID EJECTION HEAD, ULTRASONIC MOTOR, AND DUST REMOVING DEVICE

(71) Applicant: Canon Kabushiki Kaisha, Tokyo (JP)

(72) Inventors: Kaoru Miura, Matsudo (JP); Makoto Kubota, Yokohama (JP); Jumpei Hayashi, Chofu (JP); Takayuki Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 192 days.

(21) Appl. No.: 13/715,510

(22) Filed: Dec. 14, 2012

(65) Prior Publication Data

US 2013/0154443 A1    Jun. 20, 2013

(30) Foreign Application Priority Data

Dec. 19, 2011    (JP) .................. 2011-277566

(51) Int. Cl.
| | | |
|---|---|---|
| *H01L 41/187* | (2006.01) | |
| *H01L 41/18* | (2006.01) | |
| *B08B 7/02* | (2006.01) | |
| *B41J 2/14* | (2006.01) | |
| *H02N 2/10* | (2006.01) | |
| *H02N 2/16* | (2006.01) | |

(52) U.S. Cl.
CPC .............. *H01L 41/187* (2013.01); *H01L 41/18* (2013.01); *B08B 7/028* (2013.01); *B41J 2/14233* (2013.01); *H02N 2/106* (2013.01); *H02N 2/163* (2013.01); *B41J 2202/03* (2013.01)
USPC .................................. 310/358; 252/62.9 PZ

(58) Field of Classification Search
USPC ................. 310/358, 328, 366, 365, 367, 311; 252/62.9 R, 629 PZ; 501/134, 135, 136
See application file for complete search history.

(56) References Cited

U.S. PATENT DOCUMENTS

| | | | | |
|---|---|---|---|---|
| 6,383,416 | B1 * | 5/2002 | Hamada et al. | 252/521.5 |
| 7,090,785 | B2 * | 8/2006 | Chiang et al. | 252/62.9 R |
| 2010/0155647 | A1 * | 6/2010 | Saito et al. | 252/62.9 PZ |

FOREIGN PATENT DOCUMENTS

| | | |
|---|---|---|
| JP | 2010-143788 A | 7/2010 |
| JP | 2010-143789 A | 7/2010 |

OTHER PUBLICATIONS

M. Higashi et al., Chemistry of Materials, vol. 21, pp. 1543-1549 (2009).

* cited by examiner

*Primary Examiner* — Thomas Dougherty
*Assistant Examiner* — Karen B Addison
(74) *Attorney, Agent, or Firm* — Canon U.S.A., Inc. IP Division

(57) ABSTRACT

A piezoelectric material contains a perovskite oxynitride expressed by the General Formula: $(Ba_{1-x}Sr_x)(Ti_{1-3z}(Nb_{1-y}Ta_y)_{3z})(O_{1-w}N_w)_3$. In the formula, x, y, z and w are numerical values satisfying the relationships: $0 \leq x \leq 1$, $0 \leq y \leq 1$, $0 < z \ll 1/3$, and $0 < w \leq z$. Also, z can be $0.1 \leq z \leq 0.2$. The piezoelectric material may be in the form of a film having a thickness in the range of 200 nm to 10 μm that is disposed on a substrate. The perovskite oxynitride may have a tetragonal crystal structure.

8 Claims, 6 Drawing Sheets

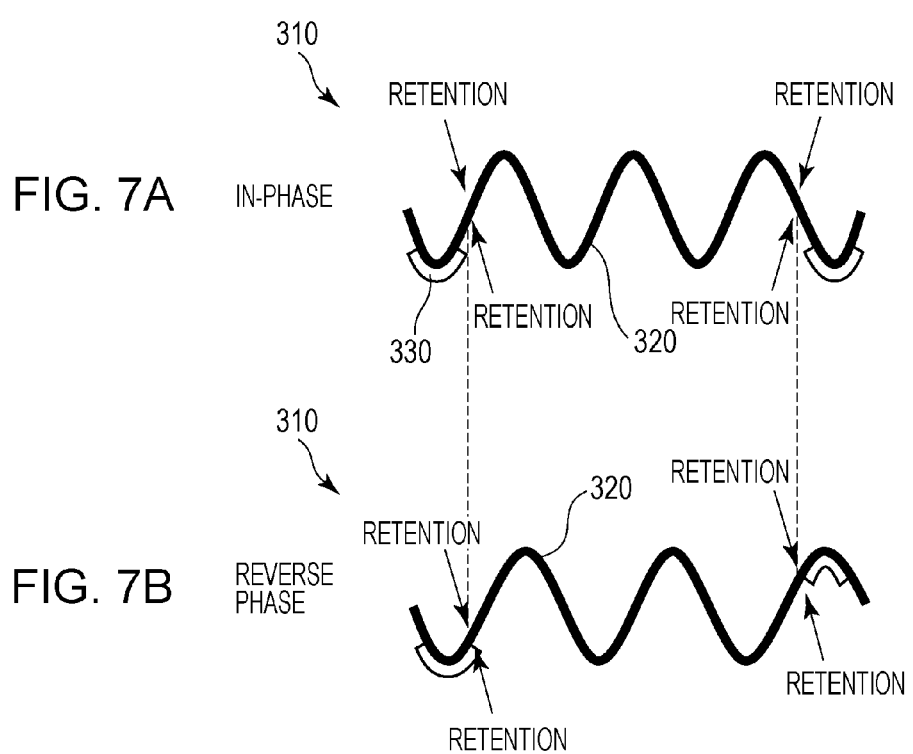

PIEZOELECTRIC MATERIAL, PIEZOELECTRIC ELEMENT, LIQUID EJECTION HEAD, ULTRASONIC MOTOR, AND DUST REMOVING DEVICE

BACKGROUND OF THE INVENTION

1. Field of the Invention

The present invention relates to piezoelectric materials, and, particularly, to a lead-free piezoelectric material. The present invention also relates to a piezoelectric element, a liquid ejection head, an ultrasonic motor and a dust removing device that use the piezoelectric material.

2. Description of the Related Art

Piezoelectric materials are broadly used in, for example, actuators, ultrasonic oscillators, micro power sources, high-voltage generators. Many of the piezoelectric materials used in these devices are materials called PZT (lead zirconate titanate), which is an oxide containing lead (Pb), zirconium (Zr) and titanium (Ti). On the other hand, from the viewpoint of environmental protection, lead-free piezoelectric materials are being developed.

For example, a Ba-based perovskite oxide expressed by the general formula $BaM'O_3$ is an example of the lead-free piezoelectric material. In this general formula, M' represents a single element or a mixed crystal containing two or more elements in a certain composition ratio, and the charge of $BaM'O_3$ is neutral. $BaTiO_3$, which has a tetragonal crystal structure at room temperature, is an example of the piezoelectric materials expressed by $BaM'O_3$.

In addition to oxides, oxynitride is another example of the perovskite compounds. $BaTaO_2N$ is a lead-free perovskite oxynitride used as a photocatalyst, as described in M. Higashi et al., Chemistry of Materials, vol. 21, pp. 1543-1549 (2009).

In Japanese Patent Laid-Open No. 2010-143788, a lead-free alkaline-earth metal-Bi perovskite oxynitride such as $Ba_{0.6}Bi_{0.4}Ti_{0.6}Si_{0.4}O_{2.6}N_{0.4}$ is used as a piezoelectric material. This material has a tetragonal crystal structure because of the presence of Bi atoms, and particularly when N atoms are arranged in the c axis direction, the tetragonal crystal structure has a large c/a (ratio of the c axis length to the a axis length in a unit cell). Accordingly, a piezoelectric material having a high Curie temperature ($T_C$) can be expected, where the Curie temperature ($T_C$) is defined as the temperature at which structural phase transition occurs from a tetragonal form into a cubic form and the piezoelectric characteristics of the material are disappeared. Also, the lead-free perovskite oxynitride shows a piezoelectric constant $d_{33}$ half that of $BaTiO_3$. The piezoelectric constant $d_{33}$ is defined as a small strain in the c axis direction at a constant stress when a very small electric field is applied in the c axis direction.

For example, Japanese Patent Laid-Open No. 2010-143789 discloses an alkaline-earth metal-based perovskite oxynitride such as $SrNbO_2N$ as a perovskite oxynitride piezoelectric material. This is a piezoelectric material having a tetragonal crystal structure, and when N atoms are arranged in the c axis direction, the absolute value of the product of the piezoelectric constant $d_{31}$ multiplied by the Young's modulus $Y_{11}$ is large. The piezoelectric constant $d_{31}$ refers to a small strain in the a axis direction at a constant stress when a very small electric field is applied in the c axis direction.

However, the perovskite oxynitride piezoelectric materials disclosed in the above-cited patent documents feature the structure in which N atoms are arranged in the c axis direction, and the synthesis process is limited. Accordingly, the industrial production of such a perovskite oxynitride piezoelectric material is difficult.

In addition, there have been reported very few lead-free perovskite compounds having a larger piezoelectric constant than $BaTiO_3$.

SUMMARY OF THE INVENTION

Accordingly, the present invention provides a piezoelectric material containing a lead-free perovskite oxynitride having a piezoelectric constant substantially larger than or equal to the piezoelectric constant of $BaTiO_3$.

The present invention also provides a piezoelectric element, a liquid ejection head, an ultrasonic motor and a dust removing device that use the perovskite oxynitride piezoelectric material.

According to an aspect of the invention, a piezoelectric material is provided which contains a perovskite oxynitride expressed by the General Formula:

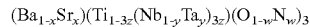

$(Ba_{1-x}Sr_x)(Ti_{1-3z}(Nb_{1-y}Ta_y)_{3z})(O_{1-w}N_w)_3$

In the formula, x, y, z and w are numerical value satisfying the relationships: $0 \leq x \leq 1$, $0 \leq y \leq 1$, $0 < z < 1/3$, and $0 < w \leq z$.

According to another aspect of the present invention, a piezoelectric element is provided which includes a piezoelectric member and a pair of electrodes in contact with the piezoelectric member. The piezoelectric member is made of the above-described piezoelectric material.

Accordingly still another aspect of the present invention, a liquid ejection head using the piezoelectric element is provided.

Also, an ultrasonic motor using the piezoelectric element is provided.

Furthermore, a dust removing device using the piezoelectric element is provided.

The piezoelectric material according to an embodiment of the invention contains a lead-free perovskite oxynitride having a piezoelectric constant substantially larger than or equal to the piezoelectric constant of $BaTiO_3$.

In an embodiment of the invention, a piezoelectric element, a liquid ejection head, an ultrasonic motor and a dust removing device that use the perovskite oxynitride piezoelectric material are provided.

The piezoelectric material of embodiments of the invention does not affect the environment because the material does not contain lead, and the piezoelectric material is superior in durability because the material does not contain alkali metals.

Further features of the present invention will become apparent from the following description of exemplary embodiments with reference to the attached drawings.

BRIEF DESCRIPTION OF THE DRAWINGS

FIGS. 7A and 7B are schematic representations illustrating the principle of the vibration of the dust removing device.

DESCRIPTION OF THE EMBODIMENTS

Figure 1:
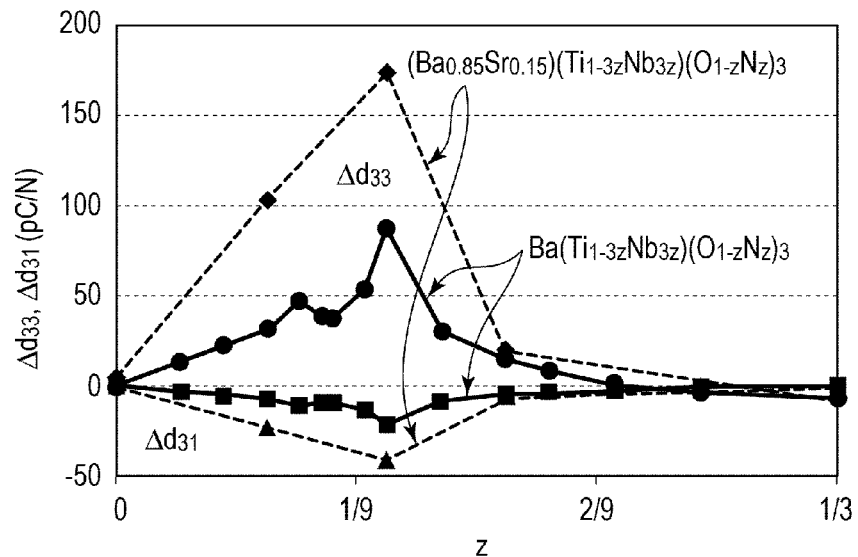
FIG. 1 shows the relationships with z of the differences $\Delta d_{33}$ and $\Delta d_{31}$ in piezoelectric constants $d_{33}$ and $d_{31}$ between a tetragonal crystalline $(Ba_{1-x}Sr_x)(Ti_{1-3z}Nb_{3z})(O_{1-z}N_z)_3$ and $BaTiO_3$.

Embodiments of the present invention will now be described in detail.

The piezoelectric material of an embodiment of the present invention contains a perovskite oxynitride expressed by the General Formula:

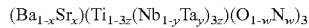

In the formula, x, y, z and w are numerical values satisfying the relationships: $0 \leq x \leq 1$, $0 \leq y \leq 1$, $0 < z < \frac{1}{3}$, and $0 < w \leq z$.

In the above General Formula, $Ba_{1-x}Sr_x$ represents the elements in the A site of the $ABX_3$ perovskite structure; $Ti_{1-3z}(Nb_{1-y}Ta_y)_{3z}$ represents the elements in the B site; and $O_{1-w}N_w$ represents the elements in the X site. Although the ideal A:B:X site ratio of the perovskite structure is 1:1:3, the site ratio of the perovskite material synthesized in practice generally varies within about ±5%. It is known that materials having an $ABX_3$ perovskite structure exhibit similar piezoelectric characteristics even though their site ratios vary within about ±5%, and the General Formula of embodiments of the present invention allows for the variation of the site ratio.

In the General Formula, x satisfies $0 \leq x \leq 1$, and preferably $0 \leq x \leq 0.5$.

y Satisfies $0 \leq y \leq 1$, and preferably $0 \leq y \leq 0.5$.

z Satisfies $0 < z < \frac{1}{3}$, and is desirably $0 < z < 0.23$ in which the absolute values of the piezoelectric constants $d_{33}$ and $d_{31}$ are larger than those of $BaTiO_3$. Also, when $0.05 \leq z \leq 0.2$ holds true, the absolute values of $d_{33}$ and $d_{31}$ can be about 1.5 times or more those of $BaTiO_3$.

Although w also satisfies the relationship $0 < w < \frac{1}{3}$, z and w are different in many cases. This is because the composition of the oxynitride piezoelectric material varies in element ratio. Although z=w holds true in the ideal composition, z≥w is suitable. This is because when w is smaller than z, nitrogen cannot be easily introduced, and oxygen is introduced instead of nitrogen. Even if the perovskite oxynitride of the above General Formula has such a composition ratio, the perovskite oxynitride is a piezoelectric material.

The piezoelectric material used in an embodiment of the present invention can be in the form of a film having a thickness in the range of 200 nm to 10 μm, preferably in the range of 250 nm to 3 μm, and disposed on a substrate. By controlling the thickness of the piezoelectric film in the range of 200 nm to 10 μm, the piezoelectric film can be used in a piezoelectric element and exhibit satisfactory piezoelectric characteristics, and the piezoelectric element is expected to be densely arranged.

In an embodiment, the perovskite oxynitride expressed by the above General Formula can have a tetragonal crystal structure. Such a perovskite oxynitride is stable in crystal structure and can exhibit satisfactory piezoelectric characteristics. Desirably, the entirety of the perovskite oxynitride is in a tetragonal crystal structure.

The piezoelectric material of embodiments of the present invention can be easily synthesized without orienting N atoms in a specific direction, and is a lead-free perovskite oxynitride piezoelectric material having piezoelectric constants substantially equal to or larger than the piezoelectric constants of $BaTiO_3$.

The piezoelectric element of an embodiment of the present invention includes a piezoelectric member made of the above-described piezoelectric material and a pair of electrodes in contact with the piezoelectric member.

The liquid ejection head, the ultrasonic motor and the dust removing device of an embodiment of the present invention include the piezoelectric element.

Experimental examples of the present invention will be described in detail with reference to the drawings.

First Embodiment

Figure 2:
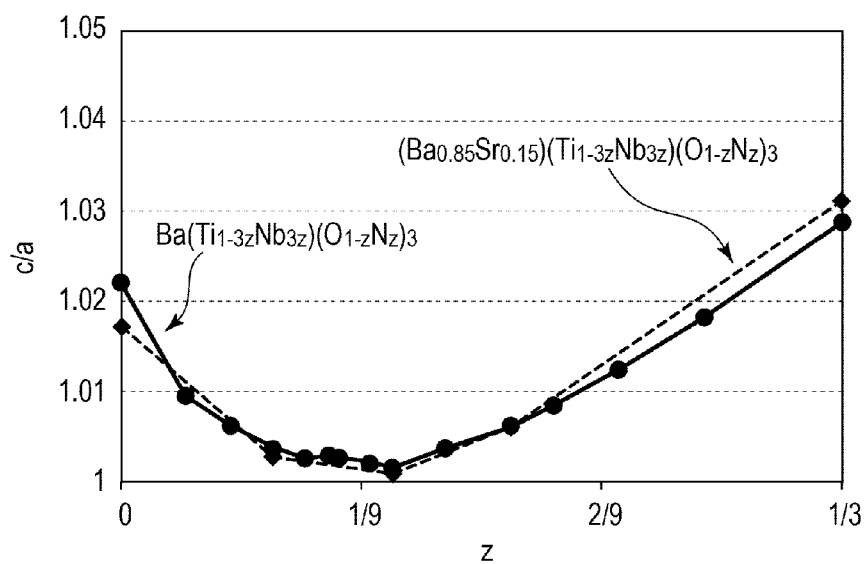
FIG. 2 shows the relationships with z of the c/a ratio of tetragonal crystal structures expressed by $(Ba_{1-x}Sr_x)(Ti_{1-3z}Nb_{3z})(O_{1-z}N_z)_3$.

A first embodiment will describe a tetragonal crystalline $(Ba_{1-x}Sr_x)(Ti_{1-3z}(Nb_{1-y}Ta_y)_{3z})(O_{1-z}N_z)_3$, which is derived from the General Formula, with reference to FIGS. 1 and 2.

The piezoelectric material of the present embodiment has a composition expressed by $(Ba_{1-x}Sr_x)(Ti_{1-3z}(Nb_{1-y}Ta_y)_{3z})(O_{1-z}N_z)_3$ ($0 \leq x \leq 1$, $0 \leq y \leq 1$, $0 < z \leq 0.125$).

The present embodiment is based on simulation results of an electronic state calculation called first-principle calculation. The outline of the electronic state calculation simulation will first be described below.

The first-principles calculation is the general term of techniques for electronic state calculations that do not use any fitting parameter, and allows simple electronic state calculation that can be performed only by inputting the atomic numbers and coordinates of the atoms constituting a unit cell, a molecule or the like.

The pseudopotential method is a technique of first-principle calculation. In this method, the potentials of the atoms constituting a unit cell are prepared in advance for electronic state calculation, and optimal structures can be advantageously calculated.

The electronic state of a system including atoms in an arbitrary composition ratio can be relatively easily calculated with high precision by virtual crystal approximation (VCA). In the VCA method, the potential of a virtual atom based on a mixture containing a plurality of atoms in a certain composition ratio is calculated in advance. Thus, the electron state in the most stable structure of a system containing atoms in an arbitrary composition ratio can be calculated by a pseudopotential method using VCA.

A package program for first-principle calculation using a VCA pseudopotential method is available, which is called "ABINIT" and has been developed by a group in which X. Gonze of Cornell University played a center role. All the electronic state calculation data shown herein are results of simulation using "ABINIT".

It will be roughly described how the total energy, the most stable structure and the piezoelectric constants of $(Ba_{1-x}Sr_x)(Ti_{1-3z}(Nb_{1-y}Ta_y)_{3z})(O_{1-z}N_z)_3$ are calculated or determined by ABINIT.

In order to determine the most stable structure of the tetragonal crystalline $(Ba_{1-x}Sr_x)(Ti_{1-3z}(Nb_{1-y}Ta_y)_{3z})(O_{1-z}N_z)_3$, a proper tetragonal crystal structure is prepared as the initial structure, and electronic state calculations including a calculation for structural optimization are performed. In this instance, VCA is applied for $Ba_{1-x}Sr_x$, $Ti_{1-3z}(Nb_{1-y}Ta_y)_{3z}$, and $O_{1-z}N_z$. The lattice constants a and c of the stable structure obtained from the electronic state calculations can be evaluated.

Also, using the stable structure obtained by the calculation for structural optimization as the initial structure, the piezoelectric e constant and the elastic compliance can be calculated from a small variation in total energy that is caused by forcibly applying a small strain to the stable structure. The piezoelectric d constant can also be derived from these values.

FIG. 1 shows as functions of z the differences $\Delta d_{33}$ and $\Delta d_{31}$ between the piezoelectric constants $d_{33}$ and $d_{31}$ of tetragonal crystalline $(Ba_{1-x}Sr_x)(Ti_{1-3z}Nb_{3z})(O_{1-z}N_z)_3$ (x=0 or 0.15, y=0, and 0<z<⅓) corresponding to the General Formula and the piezoelectric constants $d_{33}$ and $d_{31}$ of $BaTiO_3$. These piezoelectric constants were obtained from calculations using the first-principles calculation program ABINIT. In any piezoelectric material, the absolute values of the piezoelectric constants increase around the range 0<z≤0.125 and reduce around the range 0.125≤z<⅓. In other words, the piezoelectric materials shown in FIG. 1 are each directed to a composition in which z is about 0.125 and whose piezoelectric constants show maximums in absolute value. It is a great feature of the presence of a morphotropic phase boundary (MPB) region that the absolute values of piezoelectric constants are maximum, and the calculation results of the piezoelectric constants shown in FIG. 1 suggest that an MPB region may be present in a composition in which z is about 0.125.

FIG. 2 shows the relationships between the c/a ratio and z of tetragonal crystalline $(Ba_{1-x}Sr_x)(Ti_{1-3z}Nb_{3z})(O_{1-z}N_z)_3$ (x=0 or 0.15, y=0, and 0<z<⅓). In these piezoelectric materials, the c/a shows a minimum when z is about 0.125. It is well known that if an MPB region is present in a tetragonal crystal structure, a region where the c/a value of the tetragonal crystal structure is minimum is the MPB region. Thus, FIG. 2 also suggests that each of the piezoelectric materials may have an MPB region when having a composition in which z is about 0.125.

From the results shown in FIGS. 1 and 2, it is expected that an MPB region where structural phase transition from a tetragonal structure to any other crystal structure occurs is present in a composition in which z is about 0.125.

It is known that in experiments at room temperature, $BaTiO_3$ takes a tetragonal crystal structure having c/a=1.022 whereas $BaNbO_2N$ takes a cubic crystal structure.

According to the above-described findings and knowledge, the reason why the absolute values of the piezoelectric constants of the tetragonal crystalline piezoelectric materials increase when z is about 0.125 is probably that the compositions of the piezoelectric materials become closer to a composition of an MPB region than the composition of a tetragonal crystalline $BaTiO_3$.

FIG. 1 shows that the absolute values of $d_{33}$ and $d_{31}$ of $(Ba_{1-x}Sr_x)(Ti_{1-3z}Nb_{3z})(O_{1-z}N_z)_3$ (x=0 or 0.15, y=0) are larger than those of $BaTiO_3$ in the range 0<z<⅓. Desirably, this holds true in the range 0<z<0.23. The piezoelectric constants $d_{33}$ and $d_{31}$ of $BaTiO_3$ are 85.6 pC/N and −34.5 pC/N, respectively.

The most stable structures of $(Ba_{1-x}Sr_x)(Ti_{1-3z}Nb_{3z})(O_{1-z}N_z)_3$ (x=0 or 0.15, y=0) in the range 0<z≤0.125 are tetragonal at room temperature. Accordingly, these tetragonal crystalline piezoelectric materials can exhibit larger absolute values of $d_{33}$ and $d_{31}$ than those of $BaTiO_3$.

In the tetragonal crystalline piezoelectric material of the present embodiment, z satisfies 0<z≤0.125, and z can be in such a range as the absolute values of $d_{33}$ and $d_{31}$ are about 1.5 times or more those of $BaTiO_3$. More specifically, $Ba(Ti_{1-3z}Nb_{3z})(O_{1-z}N_z)_3$ (x=0) can satisfy 0.1≤z≤0.125, and $(Ba_{0.85}Sr_{0.15})(Ti_{1-3z}Nb_{3z})(O_{1-z}N_z)_3$ (x=0.15) can satisfy 0.05≤z≤0.125.

If the piezoelectric material is in the form of a thin film, the thin film can be easily formed by a known method, such as sputtering, a sol-gel method, laser ablation, and CVD, without particular limitation. A thin film mentioned herein refers to a film having a thickness of about 200 nm to 10 μm.

Ceramics of the piezoelectric materials of the present embodiment can be produced by a known sintering process without particular limitation. For example, powders of a plurality of materials are sufficiently mixed, and a binder and other additives are added as needed. Then, the mixture is compacted by pressing, and the compact is sintered in a sintering furnace. In this process, the orientation of the ceramic is desirably controlled in a certain direction.

The processes for forming a thin film of the piezoelectric material and for synthesizing a ceramic of the piezoelectric material will be described below.

Case 1

Formation of $Ba(Ti_{0.745}Nb_{0.255})(O_{0.915}N_{0.085})_3$ Thin Film (Case of x=0, y=0, z=0.085, and w=0.085)

A case will be described in which a thin film is formed by sputtering. For example, Ba, Ti and Nb metal holders and, for example, a La—$SrTiO_3$ (100) single crystal substrate are placed in a chamber into which $O_2$ gas, $N_2$ gas and Ar gas are flowing in a ratio of 1:20:20 at a pressure of 0.5 Pa. A single crystal substrate is advantageously used as the substrate from the viewpoint of enhancing the orientation of the resulting film. The piezoelectric characteristics can be enhanced by enhancing the orientation of the film.

The holders are irradiated with an Ar beam under conditions controlled so that a film having a desired elemental composition can be produced. Metals emitted from the holders by the Ar beam fly over the substrate and are deposited to form a piezoelectric film having a desired thickness in the range of 200 nm to 10 μm. The presence of nitrogen in the crystal lattice of the piezoelectric film can be checked by X-ray photoelectron spectroscopy (XPS). The nitrogen content can be determined by, for example, an oxygen/nitrogen analyzer EMGA manufactured by HORIBA. In addition, the contents of elements in the crystal other than oxygen and nitrogen can be determined by X-ray fluorescence (XRF) analysis.

Case 2

Synthesis of $(Ba_{0.90}Sr_{0.10})(Ti_{0.70}(Nb_{0.50}Ta_{0.50})_{0.30})(O_{0.90}N_{0.10})_3$ Ceramic (Case of x=0.10, y=0.50, z=0.10, and w=0.10)

A trace amount of $KClO_4$ is added as an oxidizing agent to a mixture containing barium carbonate ($BaCO_3$), strontium carbonate ($SrCO_3$), titanium nitride ($Ti_3N_4$), niobium oxide ($Nb_2O_5$) and tantalum oxide ($Ta_2O_5$) in a molar ratio of 54:6:14:9:9. The resulting mixture is heated, suspended and dissolved in an acid solution, followed by alkali treatment. The precipitate produced by the alkali treatment is collected by filtration and is then dried to yield $(Ba_{0.90}Sr_{0.10})(Ti_{0.70}(Nb_{0.50}Ta_{0.50})_{0.30})(O_{0.90}N_{0.10})_3$. The product is pulverized in a ball mill, heat-treated at 1100° C. in the air, and then compacted in a pressure forming machine. The compact is sintered at 1250° C. for 10 hours in a nitrogen atmosphere at a pressure of 10 MPa to yield the piezoelectric material having the composition of Case 2.

The sintered compact is ground and provided with electrodes. The resulting structure is polarized at an electric field intensity of 5 kV/cm to yield a piezoelectric element. The presence of nitrogen in the crystal lattice of the piezoelectric material can be checked by X-ray photoelectron spectroscopy (XPS), and the nitrogen content can be determined by, for example, an oxygen/nitrogen analyzer EMGA manufactured by HORIBA. In addition, the contents of elements in the crystal other than oxygen and nitrogen can be determined by X-ray fluorescence (XRF) analysis.

Although the number of oxygen-nitrogen sites in the compositions of Cases 1 and 2 is 3, it may be less than 3.0 depending on the firing conditions or the film forming conditions. If oxygen defects increase, the coercive electric field of the material is increased, and the piezoelectric characteristics are not exhibited in a low electric field. Therefore, in the present embodiment, the number of oxygen-nitrogen sites is desirably 2.9 or more.

Second Embodiment

A second embodiment will describe tetragonal crystalline $(Ba_{1-x}Sr_x)(Ti_{1-3z}(Nb_{1-y}Ta_y)_{3z})(O_{1-z}N_z)_3$, which is a piezoelectric material expressed by the General Formula, with reference to FIGS. 1 and 2.

The piezoelectric material of the present embodiment has a composition expressed by $(Ba_{1-x}Sr_x)(Ti_{1-3z}(Nb_{1-y}Ta_y)_{3z})(O_{1-z}N_z)3$ ($0 \leq x \leq 1$, $0 \leq y \leq 1$, $0.125 \leq z < 1/3$).

FIG. 1 shows the piezoelectric constants $d_{33}$ and $d_{31}$ of tetragonal crystalline $(Ba_{1-x}Sr_x)(Ti_{1-3z}Nb_{3z})(O_{1-z}N_z)_3$ (x=0 or 0.15, y=0, $0<z<1/3$) as functions of z. These piezoelectric constants were obtained from calculations using a first-principle calculation program ABINIT.

FIG. 1 shows that the absolute values of $d_{33}$ and $d_{31}$ of $(Ba_{1-x}Sr_x)(Ti_{1-3z}Nb_{3z})(O_{1-z}N_z)_3$ (x=0 or 0.15, y=0) are larger than those of $BaTiO_3$ in the range $0<z<1/3$. Desirably, this holds true in the range $0<z<0.23$. In the present embodiment, z satisfies $0.125 \leq z < 0.23$, and z can be in the range $0.125 \leq z \leq 0.2$, in which the absolute values of $d_{33}$ and $d_{31}$ are about 1.5 times or more those of $BaTiO_3$.

The present embodiment is different from the first embodiment to some extent. This is because the most stable structure, in the range $0.125 \leq z < 1/3$, of $(Ba_{1-x}Sr_x)(Ti_{1-3z}(Nb_{1-y}Ta_y)_{3z})(O_{1-z}N_z)_3$, which is one of the compositions expressed by the General Formula, may not be tetragonal, as supposed in FIGS. 1 and 2.

Accordingly, in order to form a $(Ba_{1-x}Sr_x)(Ti_{1-3z}(Nb_{1-y}Ta_y)_{3z})(O_{1-z}N_z)_3$ thin film having a tetragonal crystal structure in the range $0.125 \leq z < 1/3$, which is the compositional range of the present embodiment, a compact of the piezoelectric material, formed by, for example, pressing is used as a target. Also, in order to synthesize a ceramic of the piezoelectric material, for example, high-pressure synthesis is adopted instead of a known sintering process.

Processes for forming a thin film of the piezoelectric material and for high-pressure synthesis of a ceramic of the piezoelectric material will be described below.

Case 3

Formation of $(Ba_{0.90}Sr_{0.10})(Ti_{0.40}(Nb_{0.50}Ta_{050})_{0.60})(O_{0.80}N_{0.20})_3$ Thin Film (Case of x=0.10, y=0.50, z=0.20, and w=0.20)

A case will be described in which a thin film is formed by RF magnetron sputtering. A powder of a mixture containing barium carbonate ($BaCO_3$), strontium carbonate ($SrCO_2$), titanium oxide ($TiO_2$), niobium oxide ($Nb_2O_5$) and tantalum oxide ($Ta_2O_5$) in a molar ratio of 9:1:4:3:3 is compacted by uniaxial pressing at 10 MPa, and the resulting compact is used as a target. In a chamber into which $O_2$ gas, $N_2$ gas and Ar gas are flowing in a ratio of 1:20:20 at a pressure of 0.5 Pa, a $SrTiO_3$ (100) single crystal substrate on which a (100)-oriented $SrRuO_3$ film has been formed is heated to 600° C. By forming a thin film on the substrate, using the above compact as a target in an atmosphere of $O_2$, $N_2$ and Ar, the thin film can be a piezoelectric thin film having a desired thickness in the range of 200 nm to 10 μm.

The presence of nitrogen in the crystal lattice of the piezoelectric material can be checked by X-ray photoelectron spectroscopy (XPS), and the nitrogen content can be determined by, for example, an oxygen/nitrogen analyzer EMGA manufactured by HORIBA. In addition, the contents of elements in the crystal other than oxygen and nitrogen can be determined by X-ray fluorescence (XRF) analysis.

Case 4

Synthesis of $(Ba_{0.60}Sr_{0.40})(Ti_{0.40}(Nb_{0.50}Ta_{0.50})_{0.60})(O_{0.80}N_{0.20})_3$ Ceramic (Case of x=0.40, y=0.50, z=0.20, and w=0.20)

Barium carbonate ($BaCO_3$), strontium carbonate ($SrCO_3$), titanium nitride ($Ti_3N_4$), niobium oxide ($Nb_2O_5$) and tantalum oxide ($Ta_2O_5$) are mixed in a molar ratio of 18:12:4:9:9. The powder of the mixture is formed into a pellet and is then decarbonated by calcination at 900° C. under normal pressure. The pellet is pulverized, and then encapsulated in a platinum capsule in which a trace amount of $KClO_4$ is spread. The encapsulated material is thus sintered at 1200° C. and 6 GPa to yield the piezoelectric material of the present embodiment. The sintered compact is ground and is then provided with electrodes. The resulting structure is polarized at an electric field intensity of 5 kV/cm to yield a piezoelectric element.

The presence of nitrogen in the crystal lattice of the piezoelectric material can be checked by X-ray photoelectron spectroscopy (XPS), and the nitrogen content can be determined by, for example, an oxygen/nitrogen analyzer EMGA manufactured by HORIBA. In addition, the contents of elements in the crystal other than oxygen and nitrogen can be determined by X-ray fluorescence (XRF) analysis.

Although the number of oxygen-nitrogen sites in the composition of Cases 3 and 4 is 3, it may be less than 3.0 depending on the firing conditions or the film forming conditions. If oxygen defects increase, the coercive electric field of the material is increased, and the piezoelectric characteristics are not exhibited in a low electric field. Therefore, in the present embodiment, the number of oxygen-nitrogen sites is desirably 2.9 or more.

Third Embodiment

In a third embodiment, a piezoelectric element using the piezoelectric material, and a liquid ejection head, an ultrasonic motor and a dust removing device that include the piezoelectric element will be described with reference to FIGS. 3A to 7B.

A piezoelectric element including a thin film made of the piezoelectric material of an embodiment of the present invention will be described below.

The piezoelectric element of the present embodiment includes a first electrode, the piezoelectric thin film, and a second electrode.

The first and second electrodes each are defined by an electroconductive layer having a thickness of about 5 nm to 2000 nm. Any material used for electrodes of known piezoelectric elements can be used without particular limitation. Exemplary electrode materials include metals, such as Ti, Pt, Ta, Ir, Sr, In, Sn, Au, Al, Fe, Cr, Ni, Pd, Ag, and Cu, and compounds of these metals. The first and second electrode may be made of one of these metals or two or more of the metals. The first electrode and the second electrode may be made of different materials from each other. The first and second electrodes can be formed by any method without particular limitation. For example, the electrodes may be formed by baking a metal paste, or by sputtering or vapor deposition. Also, the first and second electrodes may be formed into a desired pattern.

Figure 3A:
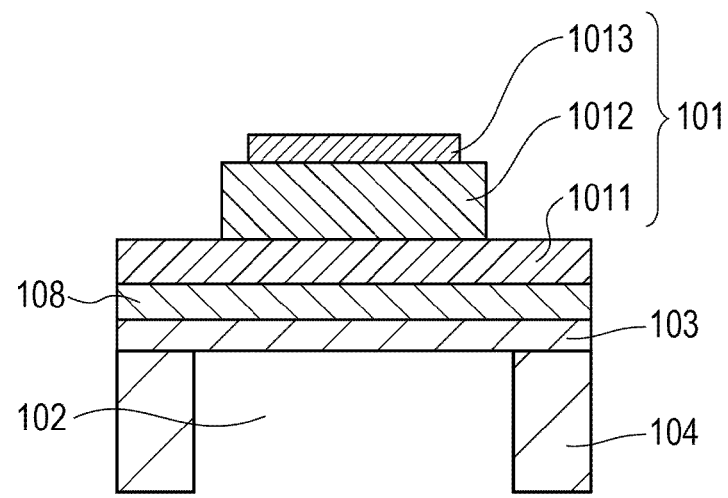
FIGS. 3A and 3B are schematic views of a liquid ejection head according to an embodiment of the present invention.
Figure 3B:
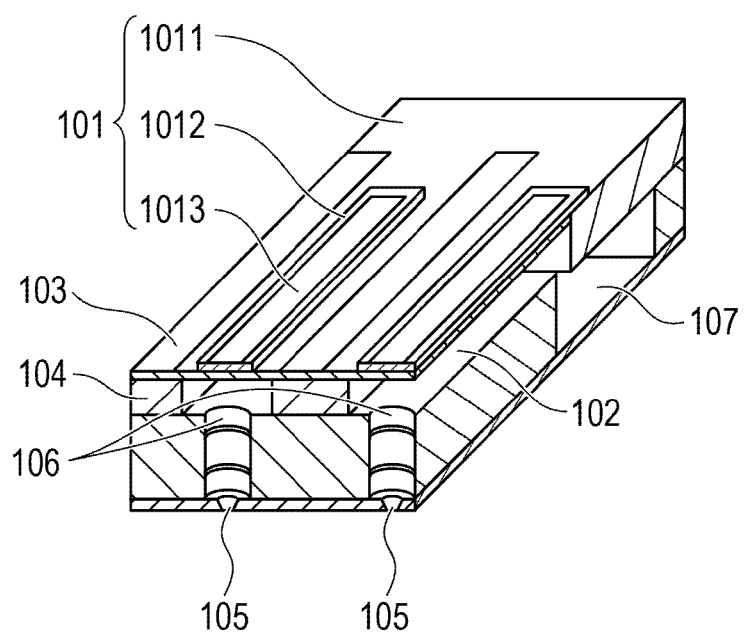

FIGS. 3A and 3B are schematic views of a liquid ejection head according to an embodiment of the present invention. As shown in FIGS. 3A and 3B, the liquid ejection head includes piezoelectric elements 101. Each of the piezoelectric elements 101 includes a first electrode 1011, a piezoelectric thin film 1012 made of the piezoelectric material, and a second electrode 1013. The piezoelectric thin film 1012 is formed into a pattern as needed, as shown in FIG. 3B.

FIG. 3B schematically shows the liquid ejection head. The liquid ejection head has ejection orifices 105, discrete liquid chambers 102, communication holes 106 communicating between the discrete liquid chambers 102 and the corresponding ejection orifices 105, liquid chamber partitions 104, a common liquid chamber 107, a vibration plate 103, and piezoelectric elements 101. Although the shape of the piezoelectric element 101 shown in FIG. 3B is rectangular, the piezoelectric element 101 may have any other shape, such as oval, circle or parallelogram. In general, the piezoelectric thin film 1012 has a shape corresponding to the shape of the discrete liquid chamber 102.

The piezoelectric element 101 and its vicinity of the liquid ejection head will be described with reference to FIG. 3A. FIG. 3A is a sectional view of the piezoelectric element taken in the width direction of the liquid ejection head shown in FIG. 3B. Although the piezoelectric element 101 has a rectangular section in FIGS. 3A and 3B, the section may be of trapezoid or inverted trapezoid.

In FIG. 3A, the first electrode 1011 is the lower electrode, and the second electrode 1013 is the upper electrode. However, the arrangement of the first and second electrodes 1011 and 1013 is not limited to that shown in the figure. For example, the first electrode 1011 may be used as the lower electrode or the upper electrode. Similarly, the second electrode 1013 may be used as the upper electrode or the lower electrode. A buffer layer 108 may be provided between the vibration plate 103 and the lower electrode.

These components are named depending on the manufacturing process of the device. The piezoelectric element produces the same effect irrespective of what the components are called.

The vibration plate 103 is vertically displaced by the expansion and contraction of the piezoelectric thin film 1012, thereby applying a pressure to a liquid in the corresponding discrete liquid chamber 102. Consequently, the liquid is ejected through the ejection orifice 105. The liquid ejection head of the present embodiment can be used in a printer or for manufacturing electronic devices.

The vibration plate 103 has a thickness in the range of 1.0 to 15 µm, preferably in the range of 1.5 to 8 µm. The vibration plate 103 may be made of any material, and for example, can be made of Si. The Si of the vibration plate 103 may be doped with B or P. The buffer layer or electrode layer on the vibration plate 103 may act as a part of the vibration plate 103.

The buffer layer 108 has a thickness in the range of 5 to 300 nm, preferably in the range of 10 to 200 nm.

The ejection orifice 105 has an equivalent circle diameter in the range of 5 to 40 µm. The shape of the ejection orifice 105 may be circular, star-like or triangular.

Ultrasonic motors including the piezoelectric element will now be described.

Figure 4A:
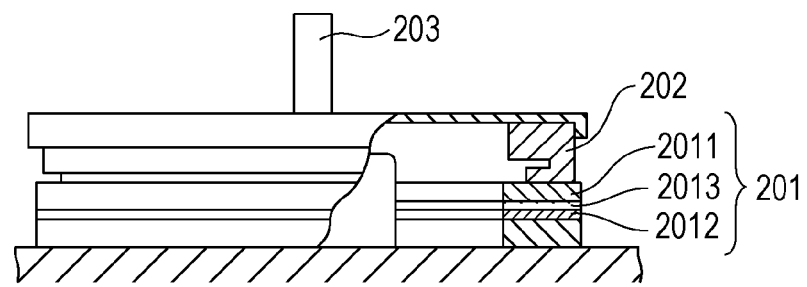
FIGS. 4A and 4B are schematic views of ultrasonic motors according to embodiments of the present invention.
Figure 4B:
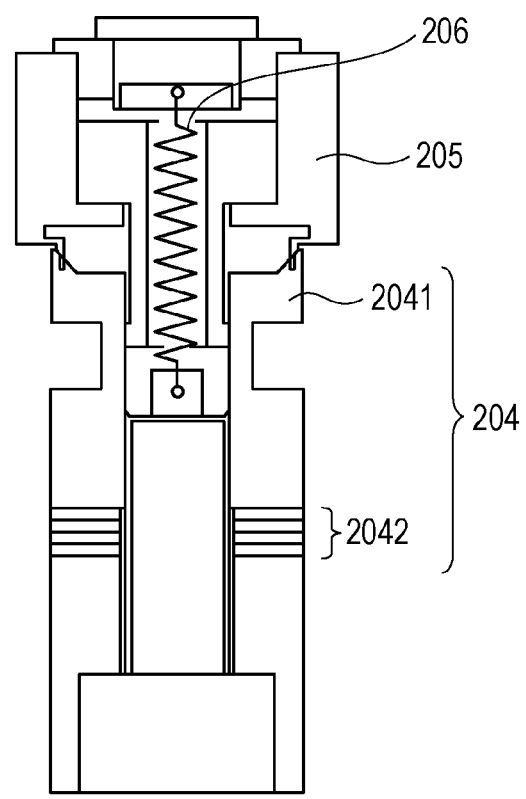

FIGS. 4A and 4B are schematic views of ultrasonic motors according to embodiments of the present invention. The ultrasonic motor shown in FIG. 4A includes a single-plate piezoelectric element. The ultrasonic motor includes an oscillator 201, a rotor 202 in contact with a sliding surface of the oscillator 201 with a pressure applied by a pressure spring (not shown), and an output shaft 203 integrated with the rotor 202. The oscillator 201 includes a metal elastic ring 2011, a piezoelectric element 2012 according to an embodiment of the present invention, and an organic adhesive 2013 (for example, epoxy or cyanoacrylate adhesive) bonding the piezoelectric element 2012 to the elastic ring 2011. The piezoelectric element 2012 includes a first and a second electrode (not shown) and a piezoelectric material between the first and second electrodes.

When a two-phase alternating voltage with a phases difference of $\pi/2$ is applied to the piezoelectric element, the oscillator 201 generates flexural traveling waves, and each point on the sliding surface of the oscillator 201 moves elliptically. If the rotor 202 is in contact with the sliding surface of the oscillator 201 with a pressure applied, the rotor 202 is rotated in the direction opposite to the direction of the flexural traveling waves by receiving a frictional force from the oscillator 201. A driven body (not shown) joined to the output shaft 203 is driven by the rotation of the rotor 202.

When a voltage is applied to the piezoelectric material, the piezoelectric material is expanded and contracted by the piezoelectric effect. If the piezoelectric material is in contact with a metal or any other elastic material, the elastic material is bent by the expansion and contraction of the piezoelectric material. The ultrasonic motor of the present embodiment is based on this principle.

FIG. 4B shows an ultrasonic motor including a piezoelectric element having a multilayer structure. The oscillator 204 of this ultrasonic motor includes a multilayer piezoelectric element 2042 disposed in a cylindrical metal elastic member 2041. The multilayer piezoelectric element 2042 includes a plurality of piezoelectric layers (not shown) made of a piezoelectric material, a first and a second electrode disposed on each surface of the multilayer structure of the piezoelectric layers, and an inner electrode within the multilayer structure. The metal elastic member 2041 is connected with bolts so as to secure the piezoelectric element 2042 therein, thus constituting the oscillator 204.

When an alternating voltage having different phases is applied to the piezoelectric element 2042, the oscillator 204 generates two orthogonal vibrations. The two vibrations are synthesized into a circular vibration that drives the top end of the oscillator 204. The oscillator 204 is provided with a circumferential groove at an upper portion thereof to increase the displacement of the driving vibration.

The rotor 205 is in contact with the oscillator 204 with a pressure applied by pressuring spring 206 and thus generates a frictional force for driving. The rotor 205 is pivotally held in a bearing.

A dust removing device including the piezoelectric element according to an embodiment of the present invention will now be described.

Figure 5A:
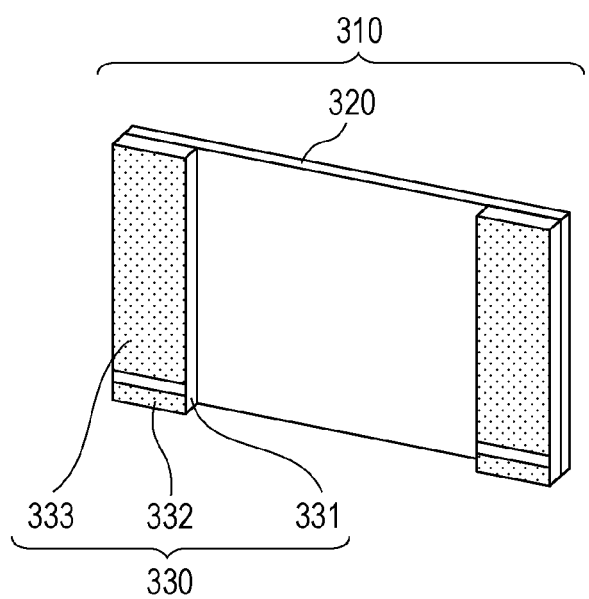
FIGS. 5A and 5B are schematic views of a dust removing device according to an embodiment of the present invention.
Figure 5B:
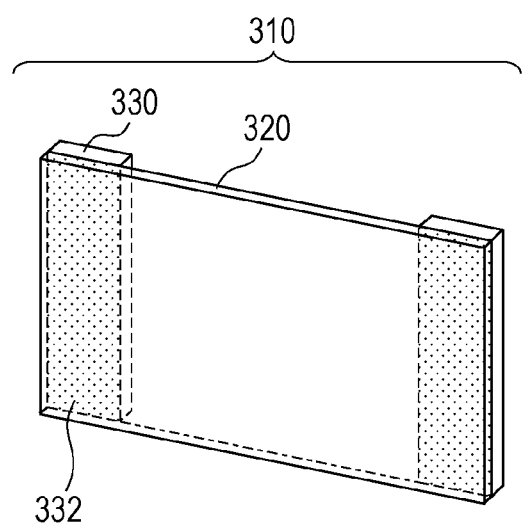

FIGS. 5A and 5B are schematic views of a dust removing device according to an embodiment of the present invention. The dust removing device 310 includes plate-like piezoelectric elements 330 and a vibration plate 320. The vibration plate 320 can be made of any material without particular limitation. For example, if the dust removing device 310 is used for optical devices, an optically transparent material or an optically reflective material is used in the vibration plate 320.

Figure 6A:
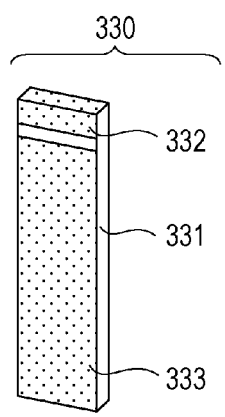
FIGS. 6A to 6C are schematic views of a piezoelectric element used in the dust removing device.
Figure 6B:
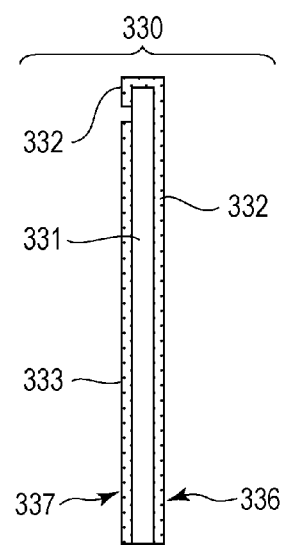
Figure 6C:
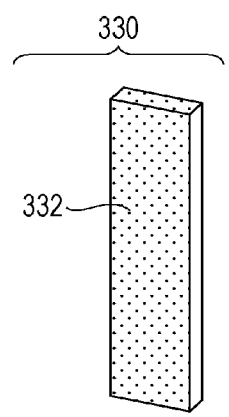

FIGS. 6A to 6C are schematic views of the piezoelectric element shown in FIGS. 5A and 5B. FIGS. 6A and 6C shows the front and the rear of the piezoelectric element 330, and FIG. 6B shows a side of the piezoelectric element 330. As shown in FIGS. 5A and 5B, the piezoelectric element 330 includes a piezoelectric member 331 made of a piezoelectric material, a first electrode 332 and a second electrode 333. The first electrode 332 and the second electrode 333 oppose each other with the piezoelectric member 331 therebetween. The surface on which the first electrode 332 is disposed in front of the piezoelectric element 330 in FIG. 6C is a first electrode surface 336. The surface on which the second electrode 333 is disposed in front of the piezoelectric element 330 in FIG. 6A is a second electrode surface 337.

The electrode surfaces each refer to the surface of the piezoelectric element on which an electrode is disposed. For example, as shown in FIGS. 6A to 6C, the first electrode 332 may round and extend to the second electrode surface 337.

The piezoelectric elements 330 are fixed to the vibration plate 320 in such a manner that the first electrode surfaces 336 of the piezoelectric elements 330 are bonded to a surface of the vibration plate 320, as shown in FIGS. 5A and 5B. When the piezoelectric element 330 operates, a stress occurs between the piezoelectric element 330 and the vibration plate 320, and the vibration plate 320 generates out-of-plane vibration. In the duct removing device 310 of the present embodiment, dust on the surface of the vibration plate 320 is removed by the out-of-plane vibration of the vibration plate 320. The term out-of-plane vibration refers to an elastic vibration that displaces the vibration plate in the direction of the optical axis, that is, in the thickness direction of the vibration plate.

FIGS. 7A and 7B are schematic representations illustrating the principle of the vibration of the dust removing device 310. FIG. 7A shows a state where out-of-plane vibration is generated in the vibration plate 320 by applying an in-phase alternating electric field to the pair of piezoelectric elements 330 disposed on the right and left side of the device. The piezoelectric member 331 of each piezoelectric element 330 is polarized in the same direction as the thickness direction of the piezoelectric element 330, and the dust removing device 310 is operated in a seventh-order vibration mode.

FIG. 7B shows a state where out-of-plane vibration is generated in the vibration plate 320 by applying a reverse phase alternating electric field with a phase difference of 180° to the pair of piezoelectric elements 330. In this instance, the dust removing device 310 operates in a sixth-order vibration mode. By operating the dust removing device 310 in at least two vibration modes depending on cases, dust on the surface of the vibration plate can be removed effectively.

As described above, the piezoelectric element according to embodiments of the present invention is suitable for liquid ejection heads, ultrasonic motors and dust removing devices.

By using a lead-free piezoelectric thin film containing the perovskite oxynitride of an embodiment of the present invention in a liquid ejection head, the liquid ejection head can exhibit a nozzle density and an ejection power that are substantially equal to or higher than those of liquid ejection heads including a lead-containing piezoelectric thin film.

By using a lead-free piezoelectric member containing the perovskite oxynitride of an embodiment of the present invention in an ultrasonic motor, the ultrasonic motor can exhibit a driving force and a durability that are substantially equal to or higher than those of ultrasonic motors including a lead-containing piezoelectric member.

By using a lead-free piezoelectric member containing the perovskite oxynitride of an embodiment of the present invention in a dust removing device, the duct removing device exhibits a dust removing efficiency substantially equal to or higher than that of dust removing devices including a lead-containing piezoelectric member.

The piezoelectric material of embodiments of the present invention can also be used in other devices, such as ultrasonic oscillators, piezoelectric actuators, piezoelectric sensors, and ferroelectric memory devices, in addition to the liquid ejection head and the ultrasonic motor.

The piezoelectric material exhibits a larger piezoelectric constant than that of $BaTiO_3$, and, accordingly, can be used in piezoelectric elements, liquid ejection heads, ultrasonic motors, dust removing devices, and other devices.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-277566 filed Dec. 19, 2011, which is hereby incorporated by reference herein in its entirety.

What is claimed is:

1. A piezoelectric material comprising:
   a perovskite oxynitride expressed by the General Formula:

$$(Ba_{1-x}Sr_x)(Ti_{1-3z}(Nb_{1-y}Ta_y)_{3z})(O_{1-w}N_w)_3$$

wherein x, y, z and w represent numerical values satisfying the relationships $0 \leq x \leq 1$, $0 \leq y \leq 1$, $0 < z < 1/3$, and $0 < w \leq z$.

2. The piezoelectric material according to claim 1, wherein z satisfies the relationship $0.1 \leq z \leq 0.2$.

3. The piezoelectric material according to claim 1, wherein the piezoelectric material is in the form of a film having a thickness in the range of 200 nm to 10 μm that is disposed on a substrate.

4. The piezoelectric material according to claim 1, wherein the perovskite oxynitride has a tetragonal crystal structure.

5. A piezoelectric element comprising:
   a piezoelectric member made of the piezoelectric material as set forth in claim 1; and
   a pair of electrodes in contact with the piezoelectric member.

6. A liquid ejection head comprising the piezoelectric element as set forth in claim 5.

7. An ultrasonic motor comprising the piezoelectric element as set forth in claim 5.

8. A dust removing device comprising the piezoelectric element as set forth in claim 5.

* * * * *